(12) United States Patent
Chen (10) Patent No.: US 10,530,369 B2
(45) Date of Patent: Jan. 7, 2020

(54) SUBSAMPLING MOTION DETECTOR FOR DETECTING MOTION OF OBJECT UNDER MEASUREMENT

(71) Applicant: RichWave Technology Corp., Taipei (TW)

(72) Inventor: Tse-Peng Chen, Taipei (TW)

(73) Assignee: RichWave Technology Corp., Taipei (TW)

( * ) Notice: Subject to any disclaimer, the term of this patent is extended or adjusted under 35 U.S.C. 154(b) by 0 days.

(21) Appl. No.: 16/522,624

(22) Filed: Jul. 25, 2019

(65) Prior Publication Data

US 2019/0348987 A1 Nov. 14, 2019

Related U.S. Application Data

(62) Division of application No. 15/173,723, filed on Jun. 6, 2016, now Pat. No. 10,411,716.

(51) Int. Cl.
*H03L 7/06* (2006.01)
*H03L 7/24* (2006.01)
(Continued)

(52) U.S. Cl.
CPC ............... *H03L 7/06* (2013.01); *G01S 13/56* (2013.01); *H03L 7/087* (2013.01); *H03L 7/091* (2013.01); *H03L 7/093* (2013.01); *H03L 7/24* (2013.01)

(58) Field of Classification Search
None
See application file for complete search history.

(56) References Cited

U.S. PATENT DOCUMENTS 3,233,212 A * 2/1966 Auer, Jr. ................... G01S 1/72
367/90
3,703,722 A * 11/1972 Gershberg .............. G01S 13/56
342/28
(Continued)

FOREIGN PATENT DOCUMENTS

CN 101777871 A 7/2010
CN 102356547 B 4/2014
(Continued)

*Primary Examiner* — Berhanu Tadese
(74) *Attorney, Agent, or Firm* — Winston Hsu (57) ABSTRACT

A subsampling motion detector used to detect motion information of an object under measurement receives a first wireless radio frequency (RF) signal and transmits a second wireless RF signal, the first wireless RF signal being generated by reflecting the second wireless RF signal from the object. The subsampling motion detector has a high frequency oscillator for outputting a high frequency oscillation signal, a low frequency controllable oscillator for generating a low frequency oscillation signal according to a control signal, and a subsampling analog-to-digital converter (SSADC). The SSADC detects a phase difference between the high frequency oscillation signal and the low frequency oscillation signal at time periods indicated by the low frequency oscillation signal. The SSADC outputs a phase detection digital output signal according to the detected phase difference. The control signal is generated and the motion information of the object is calculated according to the phase detection digital output signal.

9 Claims, 11 Drawing Sheets

(51) Int. Cl.
*H03L 7/087* (2006.01)
*G01S 13/56* (2006.01)
*H03L 7/091* (2006.01)
*H03L 7/093* (2006.01)

(56) References Cited

U.S. PATENT DOCUMENTS

| | | | | |
|---|---|---|---|---|
| 4,110,754 | A * | 8/1978 | Endo | G01S 13/931 342/147 |
| 4,209,783 | A * | 6/1980 | Ohyama | G01S 13/75 340/10.3 |
| 4,336,491 | A * | 6/1982 | Buck | H03K 17/952 307/652 |
| 5,574,756 | A * | 11/1996 | Jeong | H03L 7/0812 375/376 |
| 5,619,686 | A * | 4/1997 | Lin | H04L 25/493 713/401 |
| 6,463,112 | B1 * | 10/2002 | Hafez | H03L 7/185 327/157 |
| 6,535,161 | B1 * | 3/2003 | McEwan | G01F 23/284 342/118 |
| 6,828,935 | B1 * | 12/2004 | Dunn | G01S 19/21 342/357.29 |
| 7,409,031 | B1 * | 8/2008 | Lee | H03L 7/07 375/371 |
| 7,737,743 | B1 * | 6/2010 | Gao | H03L 7/087 327/156 |
| 8,710,883 | B1 * | 4/2014 | Fang | H03L 7/0891 327/148 |
| 8,841,948 | B1 * | 9/2014 | Chien | H03L 7/081 327/149 |
| 9,197,224 | B2 * | 11/2015 | Kinget | H04L 27/18 |
| 9,306,585 | B1 * | 4/2016 | Elkholy | H03L 7/0814 |
| 9,564,908 | B2 * | 2/2017 | Song | H03L 7/0814 |
| 9,590,671 | B2 * | 3/2017 | Chen | H04B 1/10 |
| 9,603,555 | B2 * | 3/2017 | Horng | A61B 5/113 |
| 9,608,644 | B1 * | 3/2017 | Raj | H03L 7/087 |
| 9,614,537 | B1 * | 4/2017 | Nandwana | H03L 7/24 |
| 10,411,716 | B2 * | 9/2019 | Chen | H03L 7/06 |
| 2002/0039039 | A1 | 4/2002 | Maligeorgos | |
| 2002/0084856 | A1 | 7/2002 | Von Dolteren, Jr. | |
| 2008/0013456 | A1 | 1/2008 | Hafed | |
| 2009/0055677 | A1 | 2/2009 | Chen | |
| 2009/0079479 | A1 | 3/2009 | Chen | |
| 2009/0278728 | A1 | 11/2009 | Morgan | |
| 2010/0073227 | A1 | 3/2010 | Waters | |
| 2010/0237953 | A1 | 9/2010 | Kim | |
| 2011/0069792 | A1 | 3/2011 | Chen | |
| 2011/0070854 | A1 | 3/2011 | Chen | |
| 2011/0279275 | A1 | 11/2011 | Horng | |
| 2012/0209087 | A1 | 8/2012 | Horng | |
| 2012/0223855 | A1 | 9/2012 | Kurono | |
| 2012/0235689 | A1 | 9/2012 | Jau | |
| 2013/0005276 | A1 | 1/2013 | Van Driest | |
| 2013/0049711 | A1 | 2/2013 | Mirea | |
| 2013/0099943 | A1 | 4/2013 | Subramanya | |
| 2013/0120186 | A1 | 5/2013 | Rentala | |
| 2013/0127655 | A1 | 5/2013 | Kishigami | |
| 2013/0156076 | A1 | 6/2013 | Kinget | |
| 2013/0195157 | A1 | 8/2013 | Xu | |
| 2013/0234729 | A1 | 9/2013 | Jau | |
| 2014/0022111 | A1 | 1/2014 | Kuehnle | |
| 2014/0024917 | A1 | 1/2014 | McMahon | |
| 2014/0036970 | A1 | 2/2014 | Roodnat | |
| 2014/0123763 | A1 | 5/2014 | Horng | |
| 2014/0128748 | A1 | 5/2014 | Horng | |
| 2014/0350793 | A1 | 11/2014 | Schrabler | |
| 2016/0033254 | A1 | 2/2016 | Zeine | |
| 2016/0099720 | A1 | 4/2016 | Bashir | |
| 2016/0187475 | A1 | 6/2016 | Horng | |
| 2016/0209275 | A1 | 7/2016 | Cheung | |
| 2016/0226656 | A1 | 8/2016 | Okada | |
| 2016/0301433 | A1 | 10/2016 | Chen | |
| 2016/0381504 | A1 | 12/2016 | Sommer | |
| 2017/0077716 | A1 | 3/2017 | Corum | |
| 2017/0172425 | A1 | 6/2017 | Liu | |
| 2017/0353189 | A1 * | 12/2017 | Chen | H03L 7/06 |
| 2018/0337830 | A1 | 11/2018 | Padhye | |

FOREIGN PATENT DOCUMENTS

| | | |
|---|---|---|
| EP | 0 627 696 A2 | 12/1994 |
| EP | 3 089 358 A2 | 11/2016 |
| EP | 3 255 453 A1 | 12/2017 |
| EP | 3 255 453 B1 | 10/2018 |
| TW | I458271 | 10/2014 |
| TW | I476379 | 3/2015 |
| TW | I493213 | 7/2015 |
| TW | I514193 | 12/2015 |

* cited by examiner

SUBSAMPLING MOTION DETECTOR FOR DETECTING MOTION OF OBJECT UNDER MEASUREMENT

CROSS REFERENCE TO RELATED APPLICATION

This application is a divisional application of U.S. patent application Ser. No. 15/173,723, filed on Jun. 6, 2016, and entitled "Subsampling Motion Detector for Detecting Motion of Object Under Measurement". The entire content of which is incorporated herein by reference.

TECHNICAL FIELD

The invention relates to a motion detector, and more particularly, to a subsampling motion detector for detecting motion of an object under measurement.

BACKGROUND

In general, a motion detector detecting the status of displacement of an object by the Doppler Effect requires a high frequency signal output from an oscillation source operated at a high frequency to update the status of displacement of the object. Many of these motion detectors use a phase lock loop (PLL) to stabilize the high frequency oscillation signal. However, a PLL typically requires one of two implementations. In one method, a frequency divider is used for dividing the high frequency oscillation signal before the divided signal is then compared with a low frequency reference signal by a phase detector. Unfortunately, the frequency divider could consume a great deal of power during operation of the PLL. In an alternate method, a high frequency reference signal is provided for comparison with the high frequency oscillation signal by a phase detector. In this case, although the high frequency oscillation signal is not divided by a frequency divider, the phase detector has to perform phase detection at a fast rate, which could lead to increased power consumption. Therefore, a solution with lower power consumption is required in this field.

SUMMARY

According to an exemplary embodiment of the claimed invention, a subsampling motion detector configured to detect motion information of an object under measurement is disclosed. The subsampling motion detector receives a first wireless radio frequency (RF) signal and transmits a second wireless RF signal, the first wireless RF signal being generated by reflecting the second wireless RF signal from the object. The subsampling motion detector includes a controllable oscillator outputting an oscillation signal, wherein the first wireless RF signal is injected to the controllable oscillator for controlling the controllable oscillator through injecting locking. The subsampling motion detector further including a subsampling phase detector (SSPD) generating a control signal according to the oscillation signal generated by the controllable oscillator and a reference frequency, the SSPD outputting the control signal to the controllable oscillator for controlling the controllable oscillator, the oscillation signal of the controllable oscillator being locked to a multiple or fractional multiple of the reference frequency and the control signal representing the motion information of the object, wherein the value of a multiple or the fractional multiplication factor is greater than 1.

According to another exemplary embodiment of the claimed invention, a subsampling motion detector configured to detect motion information of an object under measurement is disclosed. The subsampling motion detector receives a first wireless radio frequency (RF) signal and transmits a second wireless RF signal, the first wireless RF signal being generated by reflecting the second wireless RF signal from the object. The subsampling motion detector includes a high frequency oscillator outputting a high frequency oscillation signal, wherein the first wireless RF signal is injected to the high frequency oscillator for controlling the high frequency oscillator through injecting locking, a low frequency controllable oscillator generating a low frequency oscillation signal according to a control signal, and a subsampling phase detector (SSPD) receiving the high frequency oscillation signal and the low frequency oscillation signal and detecting a phase difference between the high frequency oscillation signal and the low frequency oscillation signal at time periods indicated by the low frequency oscillation signal, the SSPD outputting a phase detection output signal according to the detected phase difference, the control signal being generated according to the phase detection output signal output from the SSPD, and the motion information of the object being calculated according to the phase detection output signal.

According to yet another exemplary embodiment of the claimed invention, a subsampling motion detector configured to detect motion information of an object under measurement is disclosed. The subsampling motion detector receives a first wireless radio frequency (RF) signal and transmits a second wireless RF signal, the first wireless RF signal being generated by reflecting the second wireless RF signal from the object. The subsampling motion detector includes a high frequency oscillator outputting a high frequency oscillation signal, wherein the first wireless RF signal is injected to the high frequency oscillator for controlling the high frequency oscillator through injecting locking, a low frequency controllable oscillator generating a low frequency oscillation signal according to a control signal, and a subsampling analog-to-digital converter (SSADC) receiving the high frequency oscillation signal and the low frequency oscillation signal and detecting a phase difference between the high frequency oscillation signal and the low frequency oscillation signal at time periods indicated by the low frequency oscillation signal, the SSADC outputting a phase detection digital output signal according to the detected phase difference, the control signal being generated according to the phase detection digital output signal output from the SSADC, and the motion information of the object being calculated according to the phase detection digital output signal.

DETAILED DESCRIPTION

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

Figure 1:
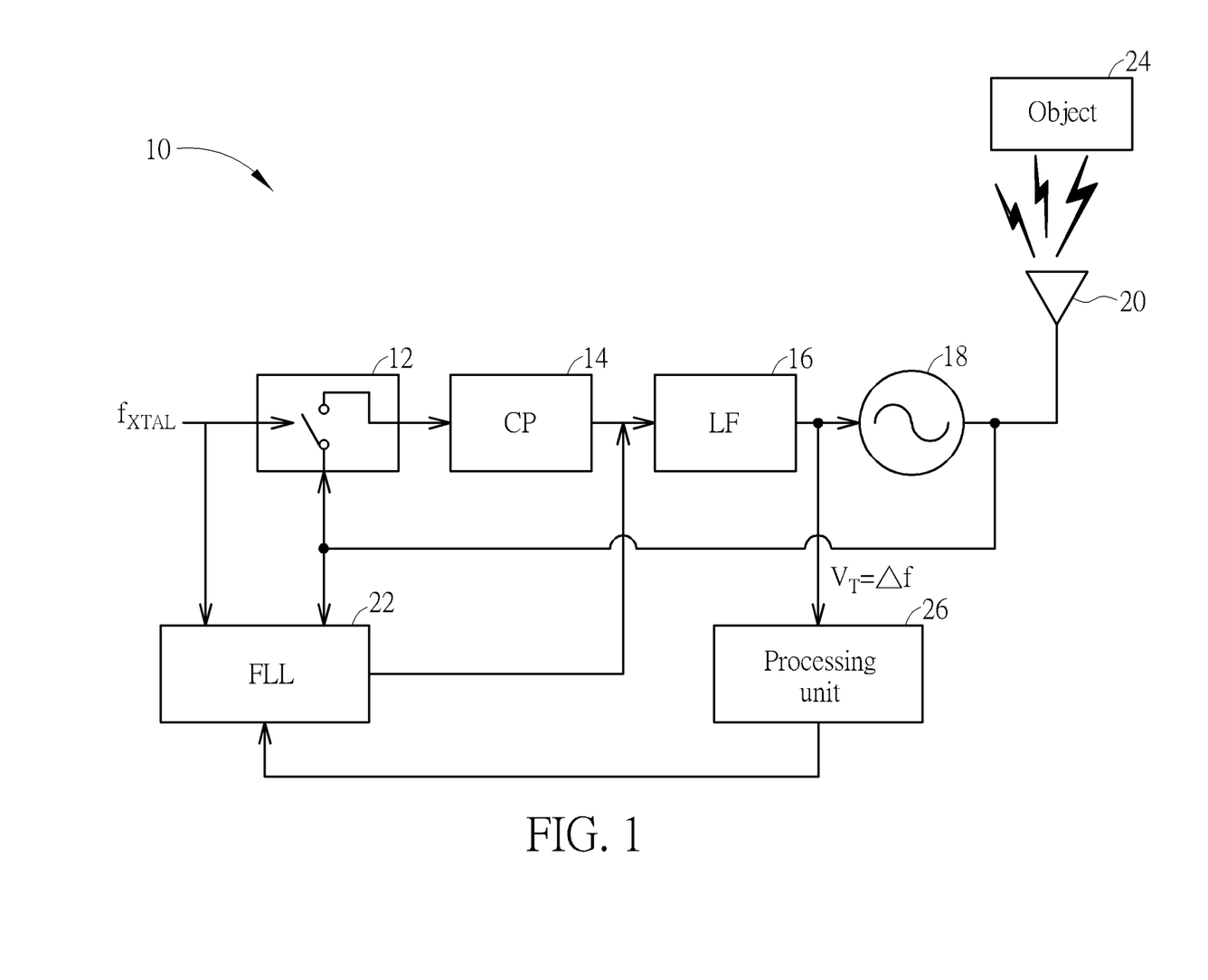
FIG. 1 is illustrates a motion detector according to a first embodiment of the present invention.

Please refer to FIG. 1. FIG. 1 illustrates a motion detector 10 according to a first embodiment of the present invention. The motion detector 10 is created using primarily analog components, and comprises a transceiver 20 that may optionally include one or more antennas, a subsampling phase detector (SSPD) 12, a charge pump 14, a loop filter 16, a voltage-controlled oscillator (VCO) 18, and a frequency lock loop (FLL) 22. The transceiver 20 receives a first wireless radio frequency (RF) signal and thereby generates a corresponding first electrical signal. The transceiver 20 is coupled to an output end of the VCO 18 and generates a second wireless RF signal that is output from the transceiver 20 to an object 24 under measurement. When the second wireless RF signal contacts the object 24, the object 24 reflects the first wireless RF signal back to the transceiver 20. Due to the Doppler Effect, the frequency of the first wireless RF signal is different from that of the second wireless RF signal. When the transceiver 20 converts the received first wireless RF signal into the corresponding first electrical signal, the first electrical signal is then input into an injection end of the VCO 18. Due to the phenomena of injection pulling and injection locking, an oscillation frequency of the VCO 18 varies due to influence of both environmental effects and a Doppler shift caused by the object 24. In other words, the oscillation frequency of the VCO 18 varies along with variation of the first electrical signal produced by the transceiver 20.

A crystal oscillator or other such reference generator provides a reference frequency $f_{XTAL}$, which is input into the SSPD 12. Besides receiving an input of the reference frequency $f_{XTAL}$ the SSPD 12 also has an input for receiving the oscillation signal from the VCO 18. The SSPD 12 performs phase detection by comparing phase differences of the reference frequency $f_{XTAL}$ and the oscillation signal from the VCO 18. The SSPD 12 samples the oscillation signal at a frequency controlled by the reference frequency $f_{XTAL}$ for performing the phase detection function. The motion detector 10 is designed such that a frequency of the oscillation signal output from the VCO 18 is an integer multiple or fractional multiple (such as 1.5) of the frequency of the reference frequency $f_{XTAL}$, wherein the value of the multiple or a fractional multiplication factor is greater than 1. Therefore, the SSPD 12 in effect provides the function of dividing the frequency of the oscillation signal into a lower frequency signal. The SSPD 12 uses much less power than a traditional phase detector and frequency divider combination of a phase lock loop (PLL).

When the SSPD 12 detects the phase difference between the oscillation signal and the reference frequency $f_{XTAL}$ at time periods indicated by the reference frequency $f_{XTAL}$, the SSPD 12 outputs a phase detection output signal to the charge pump 14 according to the detected phase difference. The charge pump 14 converts the phase detection output signal received from the SSPD 12 into an output current signal, and the loop filter 16 converts the output current signal into the control voltage used to control the VCO 18. The oscillation signal of the VCO 18 is locked to a multiple or fractional multiple of the reference frequency $f_{XTAL}$. The control voltage used to control the VCO 18 can be used to extract the motion information of the object 24. When the object 24 is not moving, and there is no environmental interference, the oscillation frequency of the VCO 18 is a carrier frequency $f_c$. However, due to injection pulling, the oscillation frequency of the VCO 18 can be pulled to $f_c+\Delta f$, where $\Delta f$ is a frequency difference that is equal to a sum of a Doppler shift $f_d$ caused by the object 24 and an injection pulling frequency shift $f_b$ caused by environmental interference. The control voltage used to control the VCO 18 can be represented as a tuning voltage $V_T$, which can represent the frequency difference $\Delta f$. Therefore, by providing the tuning voltage $V_T$ to a processing unit 26, it is possible to extract the Doppler shift $f_d$ caused by the object 24 while ignoring the effects of the injection pulling frequency shift $f_b$. In order to prevent aliasing effect, the reference frequency $f_{XTAL}$ should be greater than or equal to twice the frequency difference $\Delta f$. Also, in order to isolate the Doppler shift $f_d$ from the injection pulling frequency shift $f_b$, a bandwidth of the loop filter 16, which may be implemented as a low-pass filter, should be small enough.

The FLL 22 receives as inputs both the reference frequency $f_{XTAL}$ and the oscillation signal of the VCO 18. The FLL 22 can be controllably turned on and off, and the FLL 22 assists the SSPD 12 with detecting a phase difference between the oscillation signal and the reference frequency $f_{XTAL}$ when the FLL 22 is turned on. The FLL 22 can modify the output current signal that is provided from the charge pump 14 into the loop filter 16 for helping to control the function of the loop filter 16 when the SSPD 12 is unable to easily detect the phase difference between the oscillation signal and the reference frequency $f_{XTAL}$. By keeping the FLL 22 turned off when it is not needed, and by not using a frequency divider, the motion detector 10 is able to save significant amounts of power during normal operation. The processing unit 26 can determine when it is necessary to turn on and off the FLL 22, the processing unit 26 outputs a control signal to the FLL 22 for controlling when to turn on and turn off the FLL 22. A timer in the processing unit 26 can be used to periodically turn on the FLL 22 for several cycles to ensure that the SSPD 12 is properly detecting the phase difference between the oscillation signal and the reference frequency $f_{XTAL}$.

Figure 2:
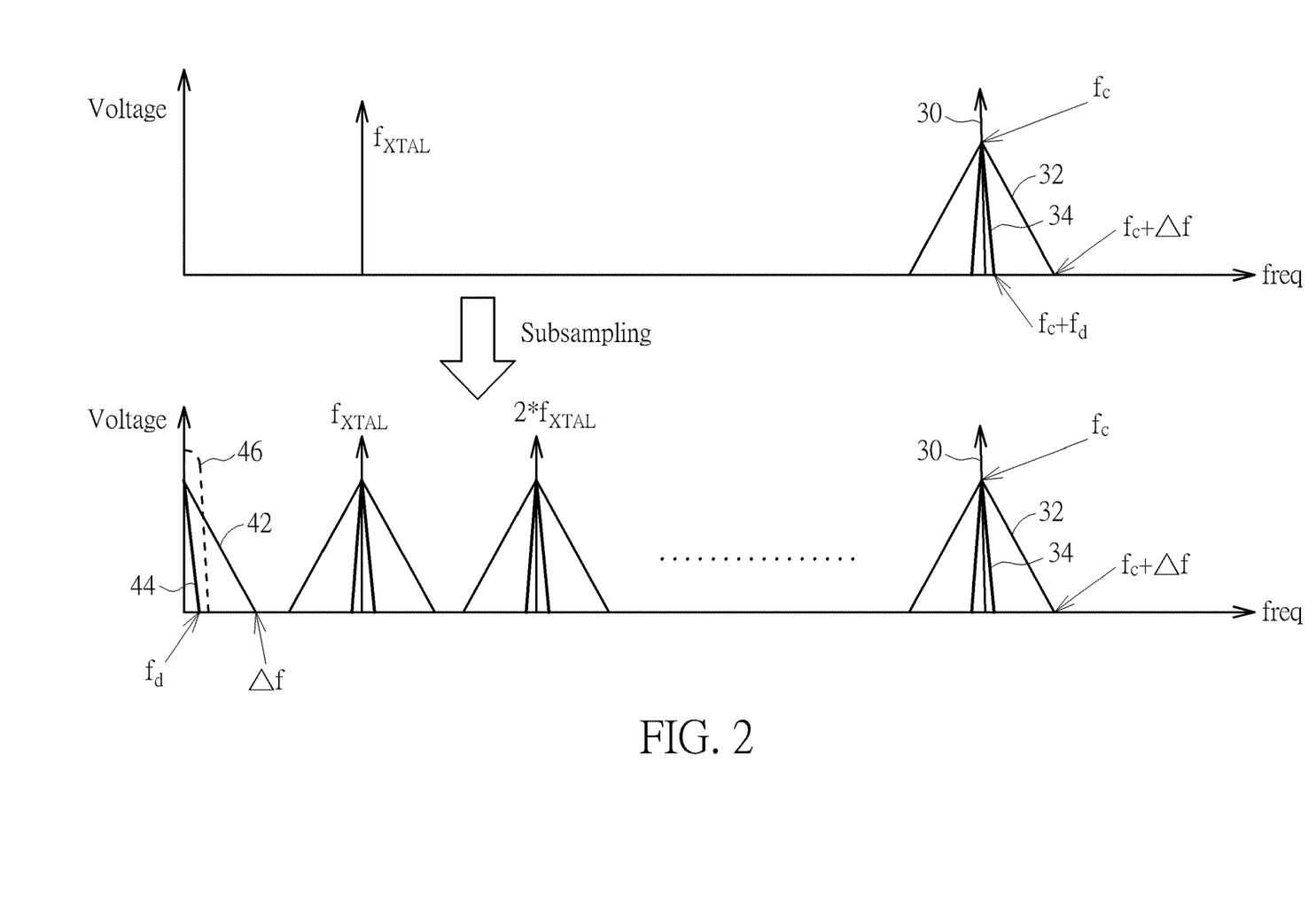
FIG. 2 illustrates relative frequencies of the carrier frequency fc and the reference frequency $f_{XTAL}$.

Please refer to FIG. 2. FIG. 2 illustrates relative frequencies of the carrier frequency $f_c$ of the VCO 18, the reference frequency $f_{XTAL}$, the Doppler shift $f_d$, and the frequency difference $\Delta f$ that is equal to the sum of the Doppler shift $f_d$ and the injection pulling frequency shift $f_b$ caused by environmental interference. A top half of FIG. 2 illustrates the value of the reference frequency $f_{XTAL}$ with respect to the carrier frequency $f_c$. The carrier frequency $f_c$ is indicated with line 30. A sum of the carrier frequency $f_c$ and the frequency difference $\Delta f$ is indicated with line 32. A sum of the carrier frequency $f_c$ and the Doppler shift $f_d$ is indicated with line 34.

A bottom half of FIG. 2 illustrates the effects of subsampling, which effectively forms a relationship between the carrier frequency $f_c$ and the reference frequency $f_{XTAL}$ such that the carrier frequency $f_c$ is a multiple or fractional multiple of the reference frequency $f_{XTAL}$. The far left side of the bottom of FIG. 2 isolates the Doppler shift $f_d$ and the frequency difference $\Delta f$ from the carrier frequency $f_c$ in order to show more clearly how the Doppler shift $f_d$ can be determined. The frequency difference $\Delta f$ is indicated with line 42, and the Doppler shift $f_d$ is indicated with line 44. Line 46 shows an example of a bandwidth of the loop filter 16 that can be selected for isolating the Doppler shift $f_d$ from the frequency difference $\Delta f$. So long as the loop filter 16 has a bandwidth greater than the size of the Doppler shift $f_d$ and less than the frequency difference $\Delta f$, the loop filter 16 can ensure that the Doppler shift $f_d$ is properly determined. Since typically the value of the Doppler shift $f_d$ is much less than that of both the injection pulling frequency shift $f_b$ caused by environmental interference and the summed value of the frequency difference $\Delta f$, the Doppler shift $f_d$ can be effectively isolated so long as the injection pulling frequency shift $f_b$ caused by environmental interference does not have a value very close to that of the reference frequency $f_{XTAL}$. As stated above, in order to prevent aliasing effect, the reference frequency $f_{XTAL}$ should be greater than or equal to twice the frequency difference $\Delta f$.

Figure 3:
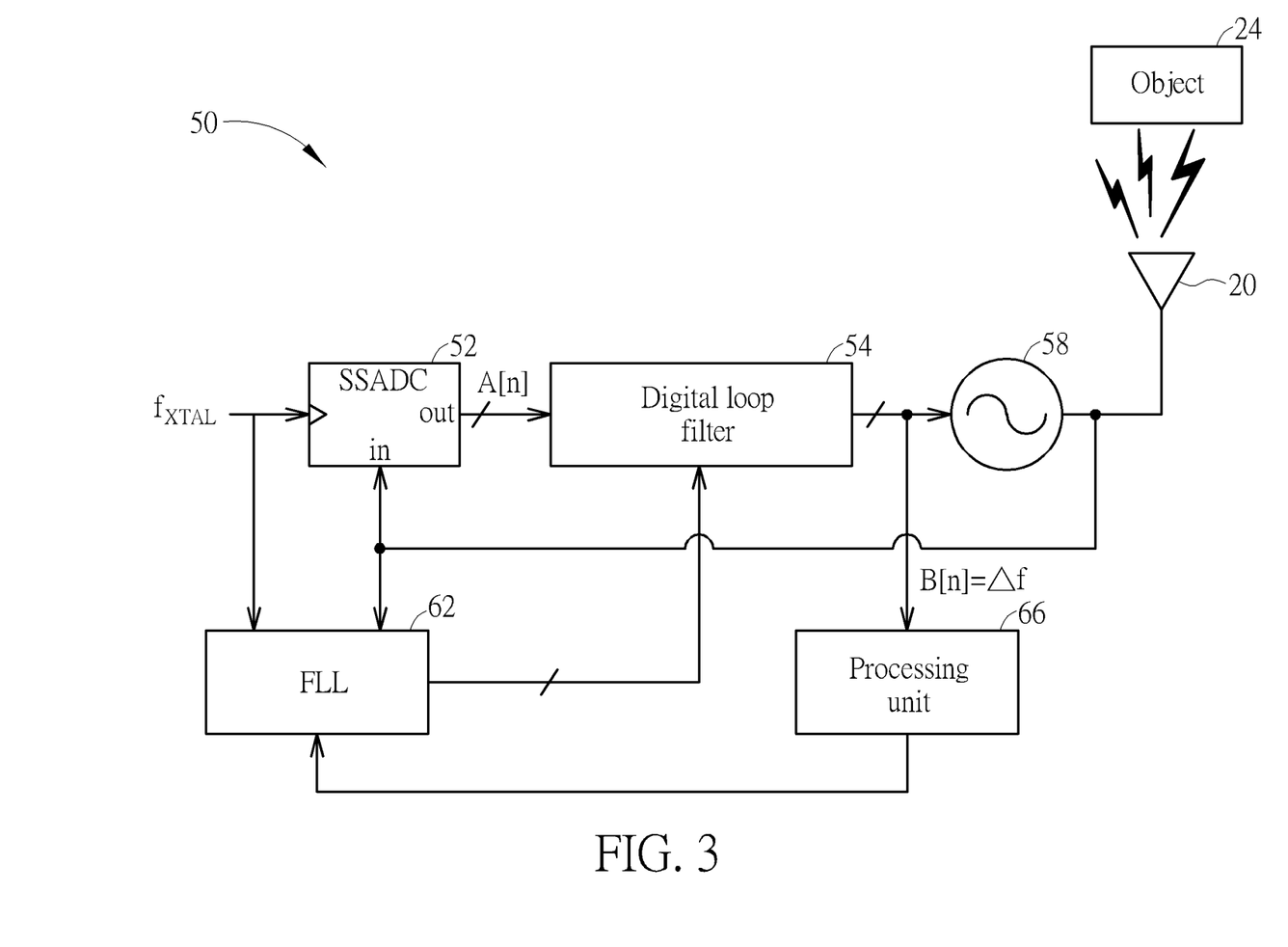
FIG. 3 illustrates a motion detector according to a second embodiment of the present invention.

Please refer to FIG. 3. FIG. 3 illustrates a motion detector 50 according to a second embodiment of the present invention. The motion detector 50 of FIG. 3 is similar to the motion detector 10 of FIG. 1, but is created using primarily digital components. Only the differences between the motion detector 50 and the motion detector 10 will be described below. The SSPD 12 and the VCO 18 of the motion detector 10 are now respectively replaced with a subsampling analog-to-digital converter (SSADC) 52 and a digitally controlled oscillator (DCO) 58. The SSADC 52 receives the reference frequency $f_{XTAL}$ and an oscillation signal output from the DCO 58 and detects a phase difference between the oscillation signal and the reference frequency $f_{XTAL}$ at time periods indicated by the reference frequency $f_{XTAL}$. The SSADC 52 outputs a phase detection digital output signal A[n] according to the detected phase difference, which is in turn input into a digital loop filter 54. The digital loop filter 54 converts the phase detection digital output signal A[n] into a digital control signal B[n] that is used for controlling the DCO 58. This digital control signal B[n] can be used to determine the frequency difference $\Delta f$ by a processing unit 66. Similar to the processing unit 26 of the motion detector 10, the processing unit 66 can also determine when it is necessary to turn on and off an FLL 62 and outputs a control signal to the FLL 62 for controlling when to turn on and turn off the FLL 62.

Figure 4:
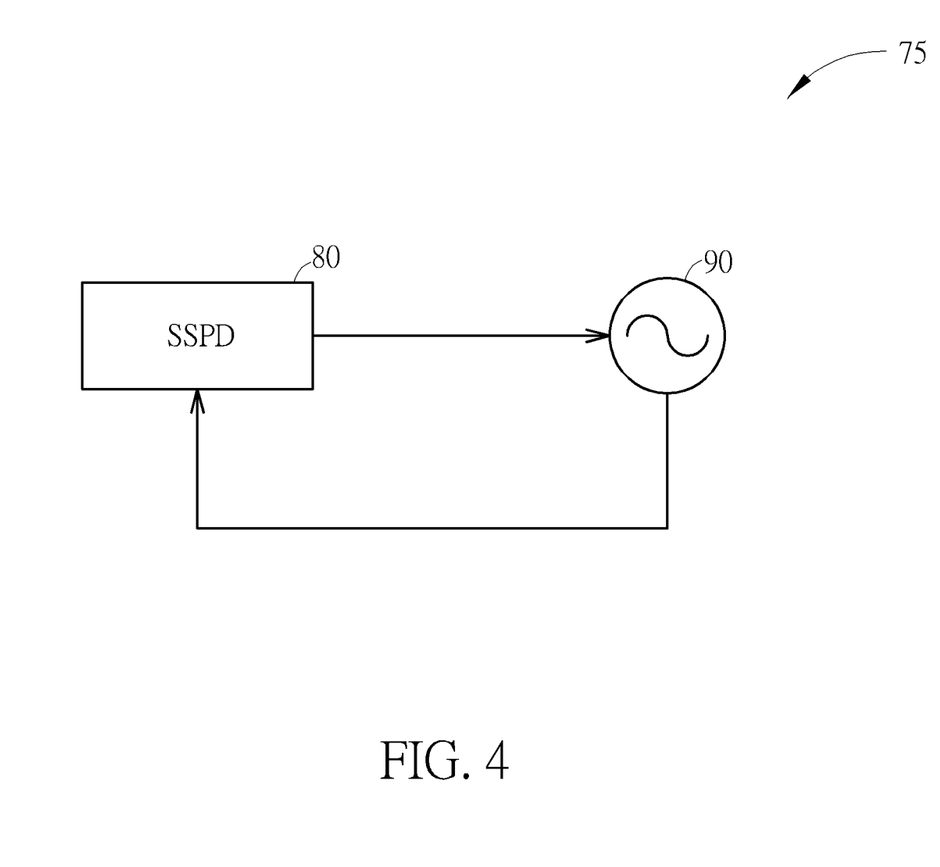
FIG. 4 illustrates a motion detector depicting a generalized version of the first embodiment and the second embodiment of the present invention.

Please refer to FIG. 4. FIG. 4 illustrates a motion detector 75 depicting a generalized version of the first embodiment and the second embodiment of the present invention. The motion detector 75 contains an SSPD 80 and a controllable oscillator 90. The SSPD 80 may be realized as either the SSPD 12 shown in FIG. 1 or the SSADC 52 shown in FIG. 3. The controllable oscillator 90 may be realized as either the VCO 18 shown in FIG. 1 or the DCO 58 shown in FIG. 3. Operation of the motion detector 75 is similar to that of the motion detectors 10 and 50 described in FIG. 1 and FIG. 3, respectively, and will not be repeated for the sake of brevity.

Figure 5:
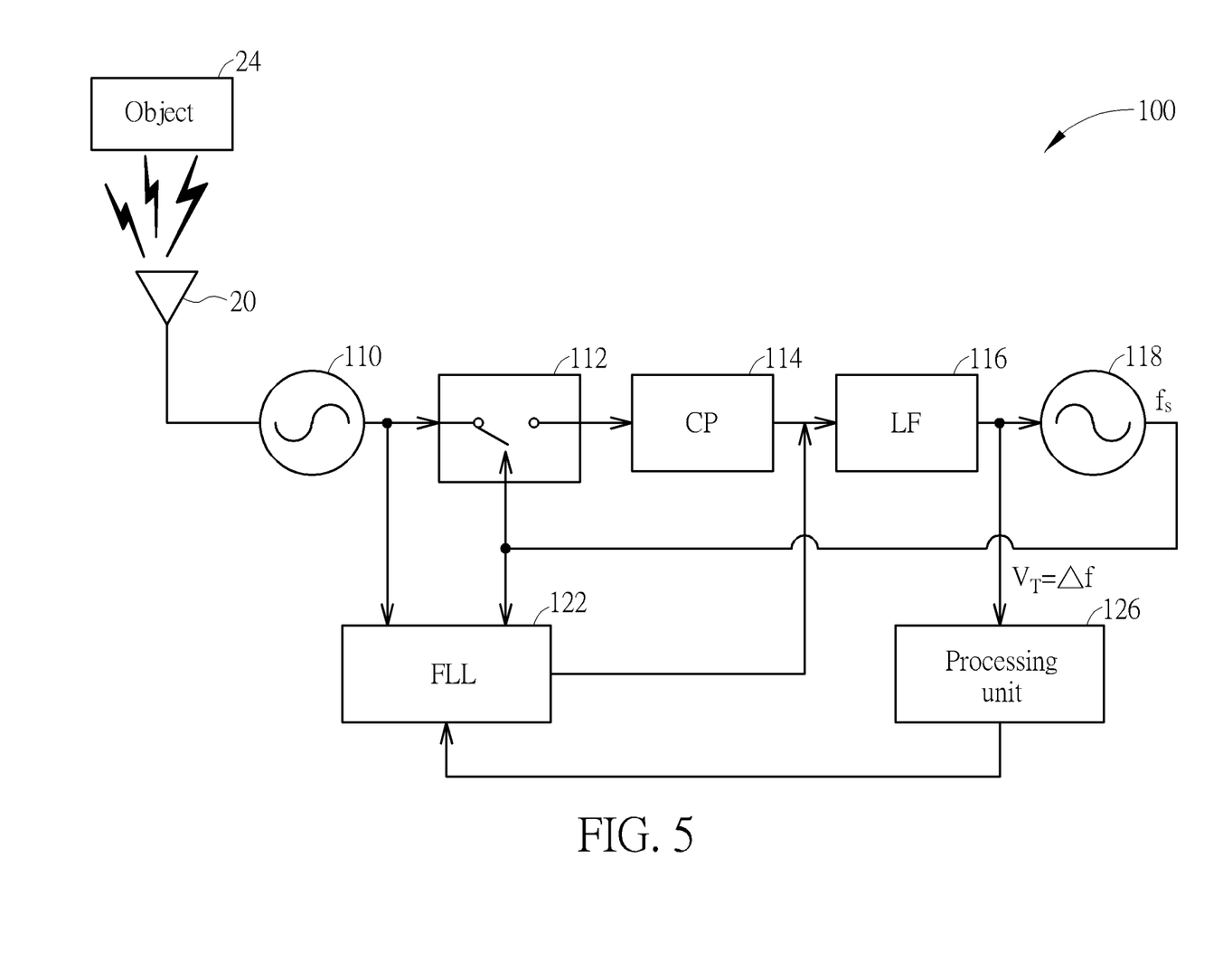
FIG. 5 illustrates a motion detector according to a third embodiment of the present invention.

Please refer to FIG. 5. FIG. 5 illustrates a motion detector 100 according to a third embodiment of the present invention. Similar to the motion detector 10 of FIG. 1, the motion detector 100 is created using primarily analog components. The main difference is the motion detector 100 contains no crystal oscillator or other reference generator for providing the reference frequency $f_{XTAL}$. Instead, the motion detector 100 comprises two different oscillators, including a high frequency oscillator 110 and a low frequency VCO 118. A high frequency oscillation signal of the high frequency oscillator 110 has a carrier frequency $f_c$. However, due to injection pulling, the frequency of the high frequency oscillation signal can be pulled to $f_c+\Delta f$, where $\Delta f$ is a frequency difference that is equal to a sum of the Doppler shift $f_d$ caused by the object 24 and an injection pulling frequency shift $f_b$ caused by environmental interference. The low frequency VCO 118 generates a low frequency oscillation signal $f_s$ according to a received control voltage. The high frequency oscillator 110 has better phase noise performance than that of the low frequency VCO 118. The low frequency VCO 118 could be less inexpensive than a crystal oscillator, and the lower frequency of the low frequency oscillation signal $f_s$ allows power savings.

The motion detector 100 further comprises an SSPD 112 having a first input for receiving the high frequency oscillation signal output from the high frequency oscillator 110, and a second input for receiving the low frequency oscillation signal $f_s$. The SSPD 112 performs phase detection by comparing phase differences of the low frequency oscillation signal $f_s$ and the high frequency oscillation signal. The SSPD 112 samples the high frequency oscillation signal at a frequency controlled by the low frequency oscillation signal $f_s$ for performing the phase detection function. The motion detector 100 is designed such that a frequency of the high frequency oscillation signal is a multiple or fractional multiple of the frequency of the low frequency oscillation signal $f_s$. Therefore, the SSPD 112 in effect provides the function of dividing the frequency of the high frequency oscillation signal into a lower frequency signal, and the SSPD 112 could use much less power than a traditional frequency divider of a PLL.

When the SSPD 112 detects the phase difference between the high frequency oscillation signal and the low frequency oscillation signal $f_s$ at time periods indicated by the low frequency oscillation signal $f_s$, the SSPD 112 outputs a phase detection output signal to the charge pump 114 according to the detected phase difference. The charge pump 114 converts the phase detection output signal received from the SSPD 112 into an output current signal, and the loop filter 116 converts the output current signal into the control voltage used to control the low frequency VCO 118. The control voltage used to control the low frequency VCO 118 can be represented as a tuning voltage $V_T$, which represents the frequency difference $\Delta f$. As in the motion detector 10, by providing the tuning voltage $V_T$ to a processing unit 126, it is possible to extract the Doppler shift $f_d$ caused by the object 24 while ignoring the effects of the injection pulling frequency shift $f_b$.

The FLL 122 receives as inputs both the high frequency oscillation signal and the low frequency oscillation signal $f_s$. The FLL 122 can be controllably turned on and off, and the FLL 122 assists the SSPD 112 with detecting a phase difference between the high frequency oscillation signal and the low frequency oscillation signal $f_s$ when the FLL 122 is turned on. The FLL 122 can modify the output current signal that is provided from the charge pump 114 into the loop filter 116 for helping to control the function of the loop filter 116 when the SSPD 112 is unable to easily detect the phase difference between the high frequency oscillation signal and the low frequency oscillation signal $f_s$. The processing unit 126 controls when to turn on and off the FLL 122, and the FLL 122 is usually kept powered off for the purpose of power savings. The processing unit 126 should ensure that the frequency of the low frequency oscillation signal $f_s$ is greater than or equal to twice the frequency difference Δf.

Figure 6:
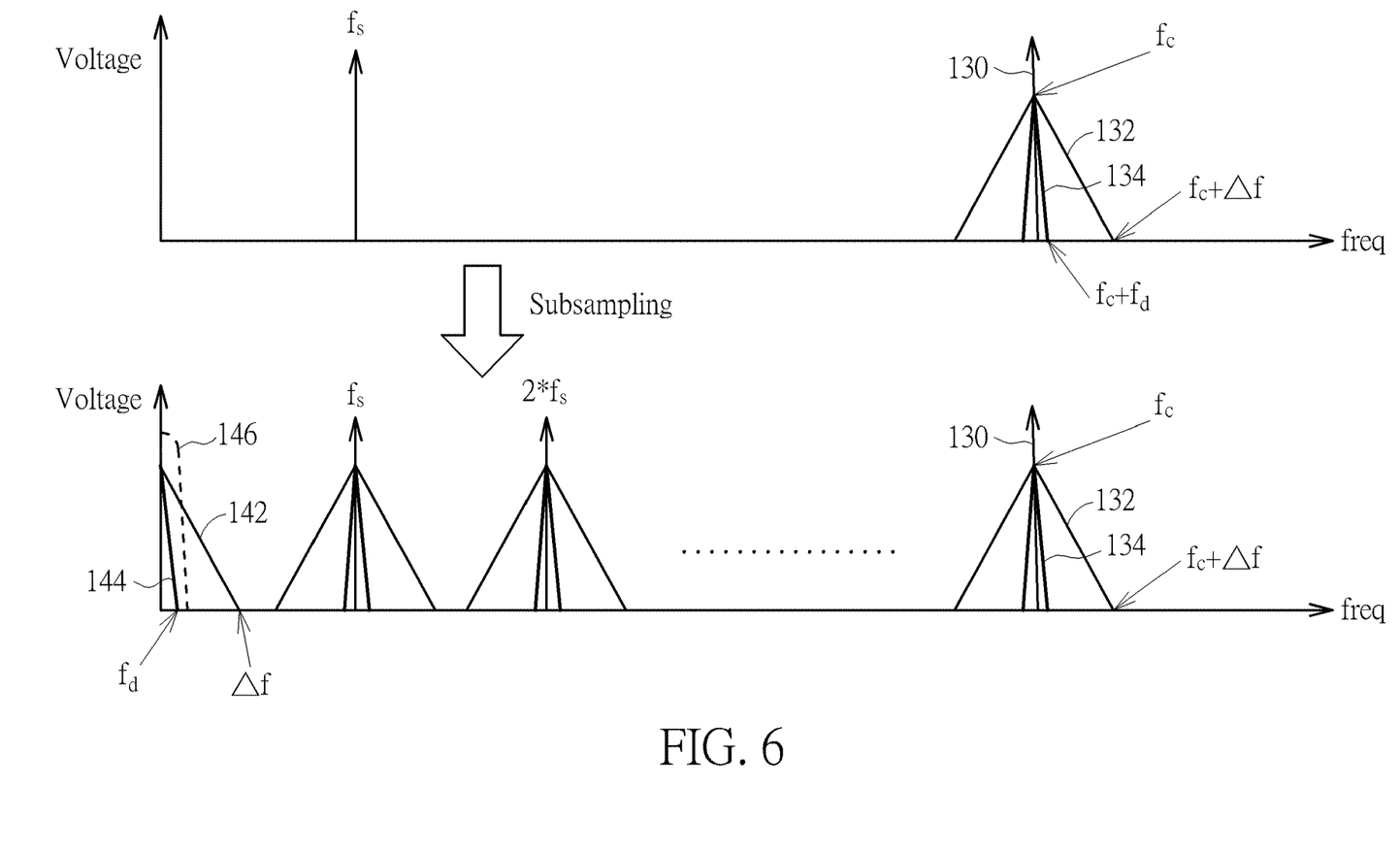
FIG. 6 illustrates relative frequencies of the carrier frequency fc and the low frequency oscillation signal $f_s$.

Please refer to FIG. 6. FIG. 6 illustrates relative frequencies of the carrier frequency $f_c$ of the VCO 18, the low frequency oscillation signal $f_s$, the Doppler shift $f_d$, and the frequency difference Δf that is equal to the sum of the Doppler shift $f_d$ and the injection pulling frequency shift $f_b$ caused by environmental interference. FIG. 6 is similar to FIG. 2, but the reference frequency $f_{rTAL}$ is replaced with the low frequency oscillation signal $f_s$ since the low frequency oscillation signal $f_s$ is used for sampling the high frequency oscillation signal in the motion detector 100. A top half of FIG. 6 illustrates the value of the low frequency oscillation signal $f_s$ with respect to the carrier frequency $f_c$. The carrier frequency $f_c$ is indicated with line 130. A sum of the carrier frequency $f_c$ and the frequency difference Δf is indicated with line 132. A sum of the carrier frequency $f_c$ and the Doppler shift $f_d$ is indicated with line 134.

A bottom half of FIG. 6 illustrates the effects of subsampling, which effectively forms a relationship between the carrier frequency $f_c$ and the low frequency oscillation signal $f_s$ such that the carrier frequency $f_c$ is a multiple or fractional multiple of the low frequency oscillation signal $f_s$. The far left side of the bottom of FIG. 6 isolates the Doppler shift $f_d$ and the frequency difference Δf from the carrier frequency $f_c$ in order to show more clearly how the Doppler shift $f_d$ can be determined. The frequency difference Δf is indicated with line 142, and the Doppler shift $f_d$ is indicated with line 144. Line 146 shows an example of a bandwidth of the loop filter 116 that can be selected for isolating the Doppler shift $f_d$ from the frequency difference Δf. In order to prevent aliasing effect, the low frequency oscillation signal $f_s$ should be greater than or equal to twice the frequency difference Δf.

Figure 7:
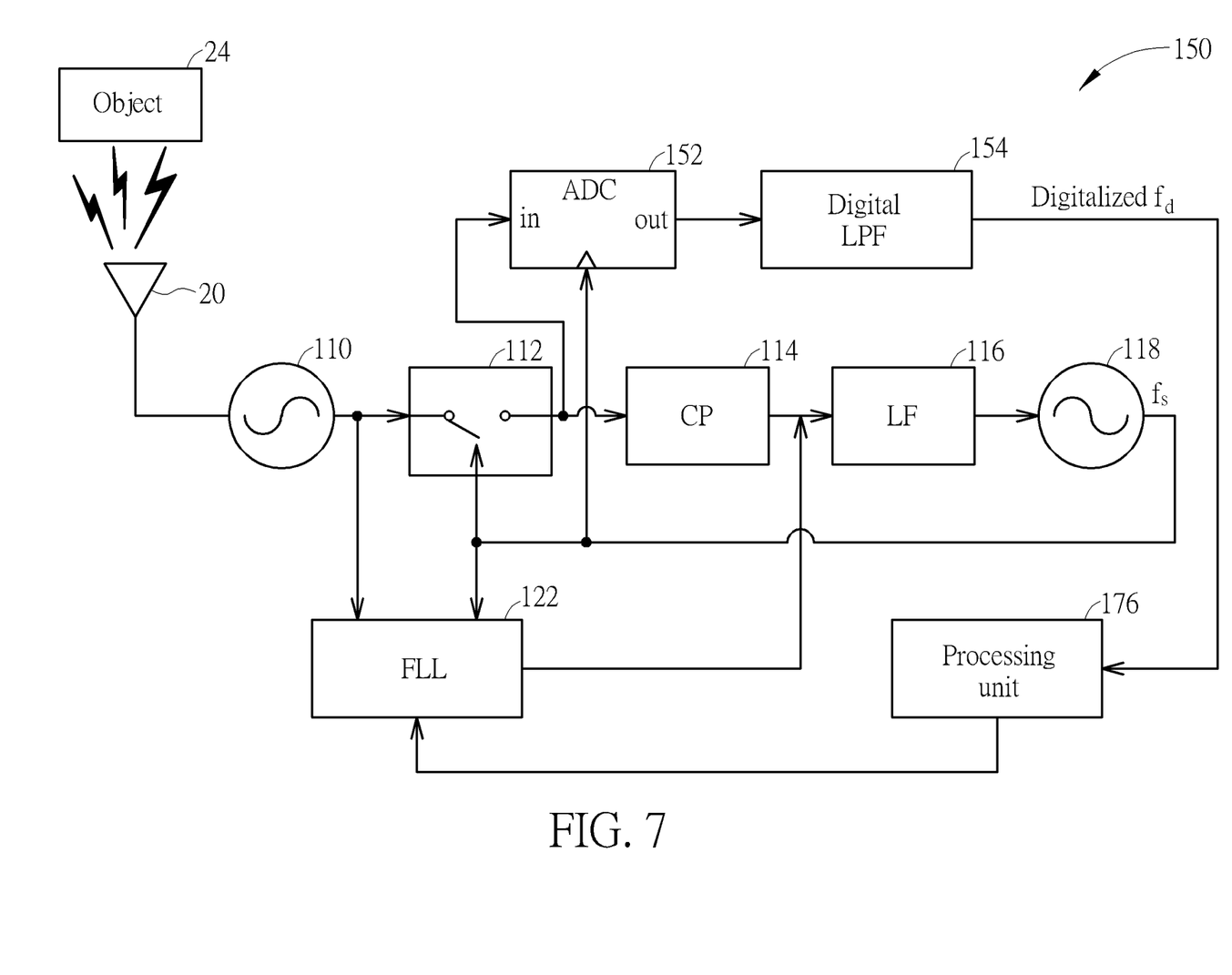
FIG. 7 illustrates a motion detector according to a fourth embodiment of the present invention.

Please refer to FIG. 7. FIG. 7 illustrates a motion detector 150 according to a fourth embodiment of the present invention. Similar to the motion detector 100 of FIG. 5, the motion detector 150 is created using primarily analog components. The main difference is the motion detector 150 contains an analog-to-digital converter (ADC) 152 and a digital low-pass filter (LPF) 154. The ADC 152 receives a clock input from the low frequency oscillation signal $f_s$, and converts the phase detection output signal output from the SSPD 112 into a phase detection digital output signal at time periods indicated by the low frequency oscillation signal $f_s$. The digital LPF 154 then converts the phase detection digital output signal into a digitalized version of the Doppler shift $f_d$, which is in turn transmitted to a processing unit 176. The processing unit 176 also controls operation of the FLL 122, as explained with respect to the motion detector 100.

Figure 8:
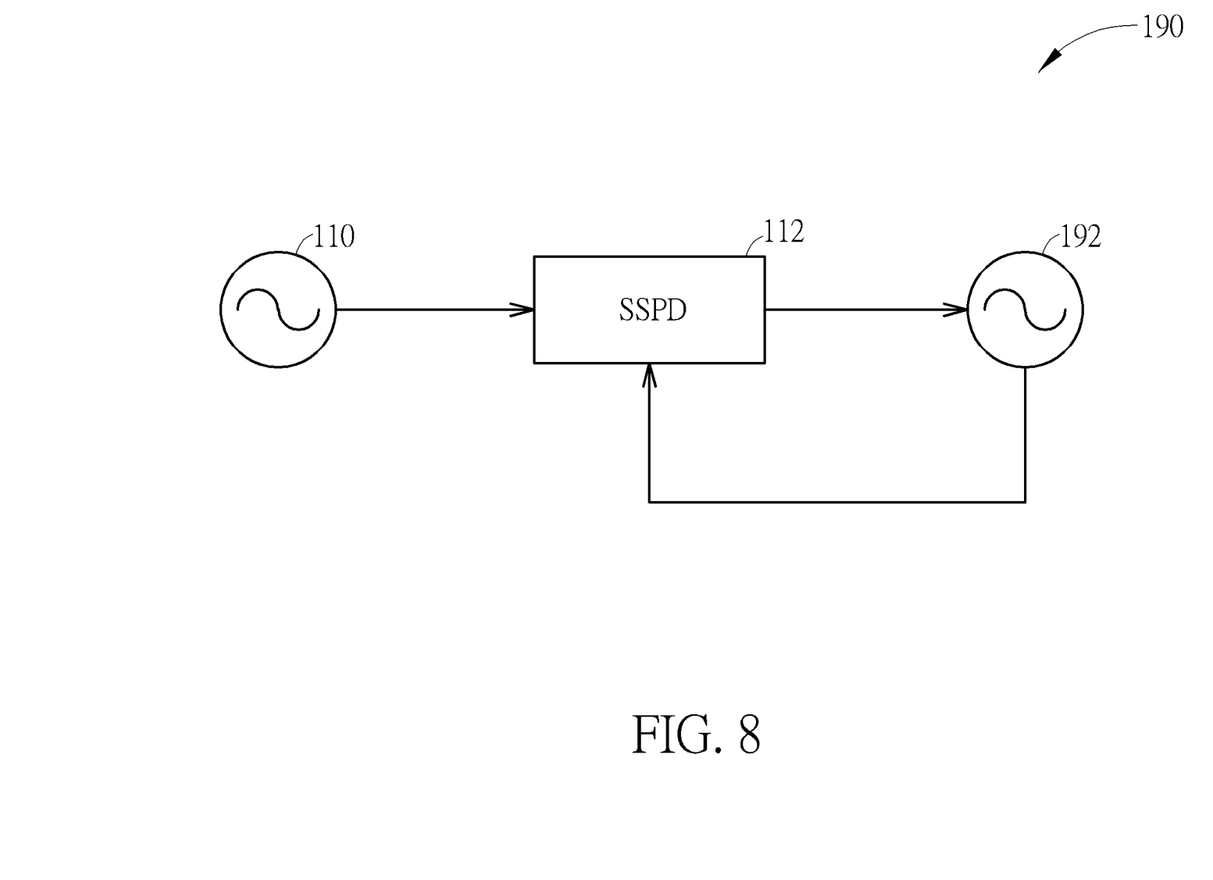
FIG. 8 illustrates a motion detector depicting a generalized version of the third embodiment and the fourth embodiment of the present invention.

Please refer to FIG. 8. FIG. 8 illustrates a motion detector 190 depicting a generalized version of the third embodiment and the fourth embodiment of the present invention. The motion detector 190 contains the high frequency oscillator 110, the SSPD 112, and a low frequency controllable oscillator 192. The low frequency controllable oscillator 192 can be realized as the low frequency VCO 118. Operation of the motion detector 190 is similar to that of the motion detectors 100 and 150 described in FIG. 5 and FIG. 7, respectively, and will not be repeated for the sake of brevity.

Figure 9:
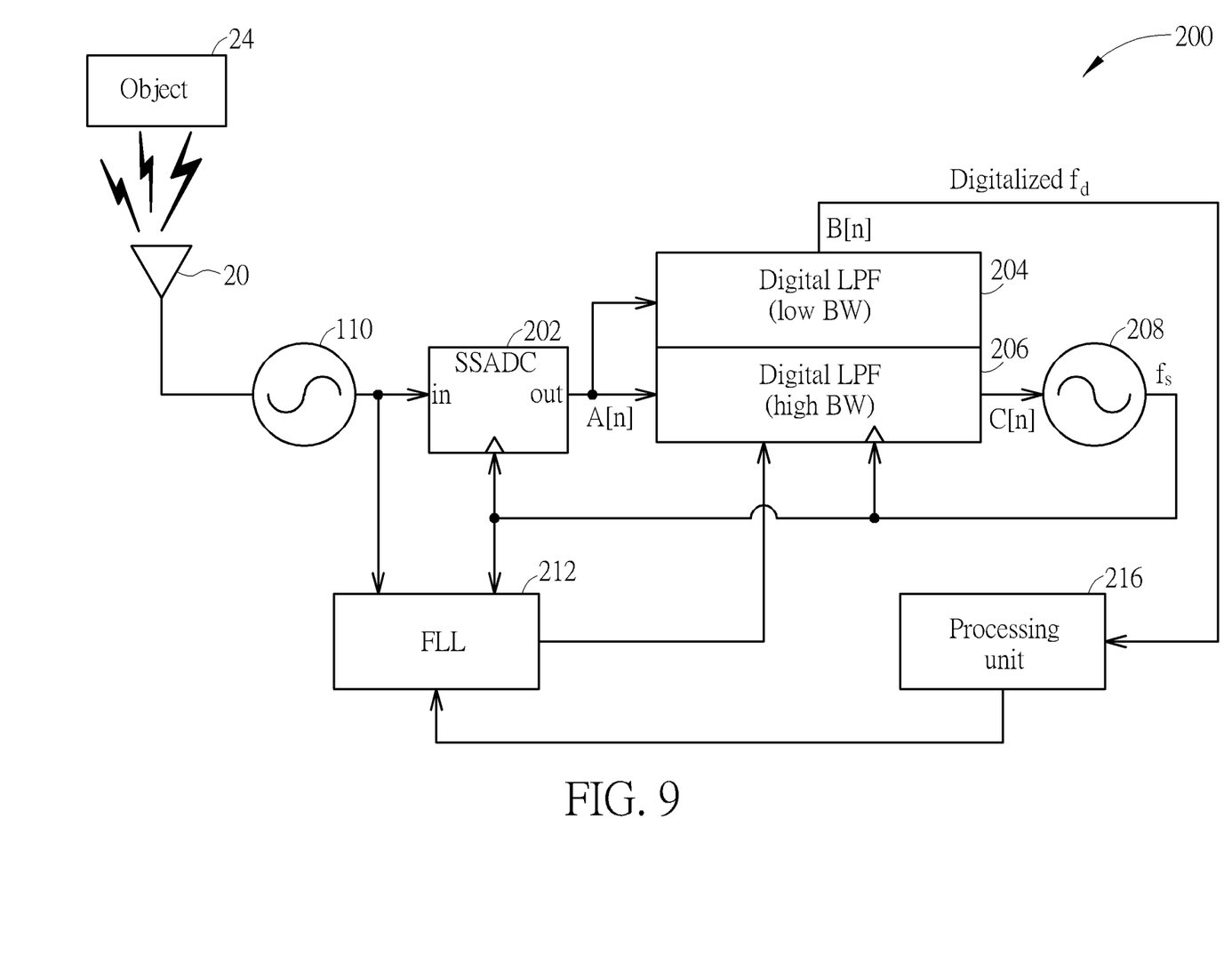
FIG. 9 illustrates a motion detector according to a fifth embodiment of the present invention.

Please refer to FIG. 9. FIG. 9 illustrates a motion detector 200 according to a fifth embodiment of the present invention. Similar to the motion detector 100 of FIG. 5, the motion detector 200 contains the high frequency oscillator 110 and another low frequency oscillator. However, the motion detector 200 is created using primarily digital components. The low frequency VCO 118 of the motion detector 100 is replaced with a low frequency DCO 208 that is controlled with a digital control signal C[n]. The low frequency DCO 208 generates a low frequency oscillation signal $f_s$ according to the digital control signal C[n]. The SSPD 112 of the motion detector 100 is replaced with an SSADC 202. The SSADC 202 receives the low frequency oscillation signal $f_s$ and the high frequency oscillation signal output from the high frequency oscillator 110, and detects a phase difference between the high frequency oscillation signal and the low frequency oscillation signal $f_s$ at time periods indicated by the low frequency oscillation signal $f_s$. The SSADC 202 outputs a phase detection digital output signal A[n] according to the detected phase difference, which is in turn input into a both a digital LPF 204 with low bandwidth and a digital LPF 206 with high bandwidth. The digital LPF 206 receives a clock input from the low frequency oscillation signal $f_s$, and converts the phase detection digital output signal A[n] into the digital control signal C[n] that is used for controlling the DCO 208. The digital LPF 204 converts the phase detection digital output signal A[n] into a motion output signal B[n] representing a digitalized version of the Doppler shift $f_d$, which is in turn transmitted to a processing unit 216. The processing unit 216 also controls operation of an FLL 212 by determining when it is necessary to turn on and off an FLL 212, and outputs a control signal to the FLL 212 for controlling when to turn on and turn off the FLL 212. The output of the FLL 212 is input into the digital LPF 206 for helping to adjust an output of the digital LPF 206, and the output of the FLL 212 is not input into the digital LPF 204.

Figure 10:
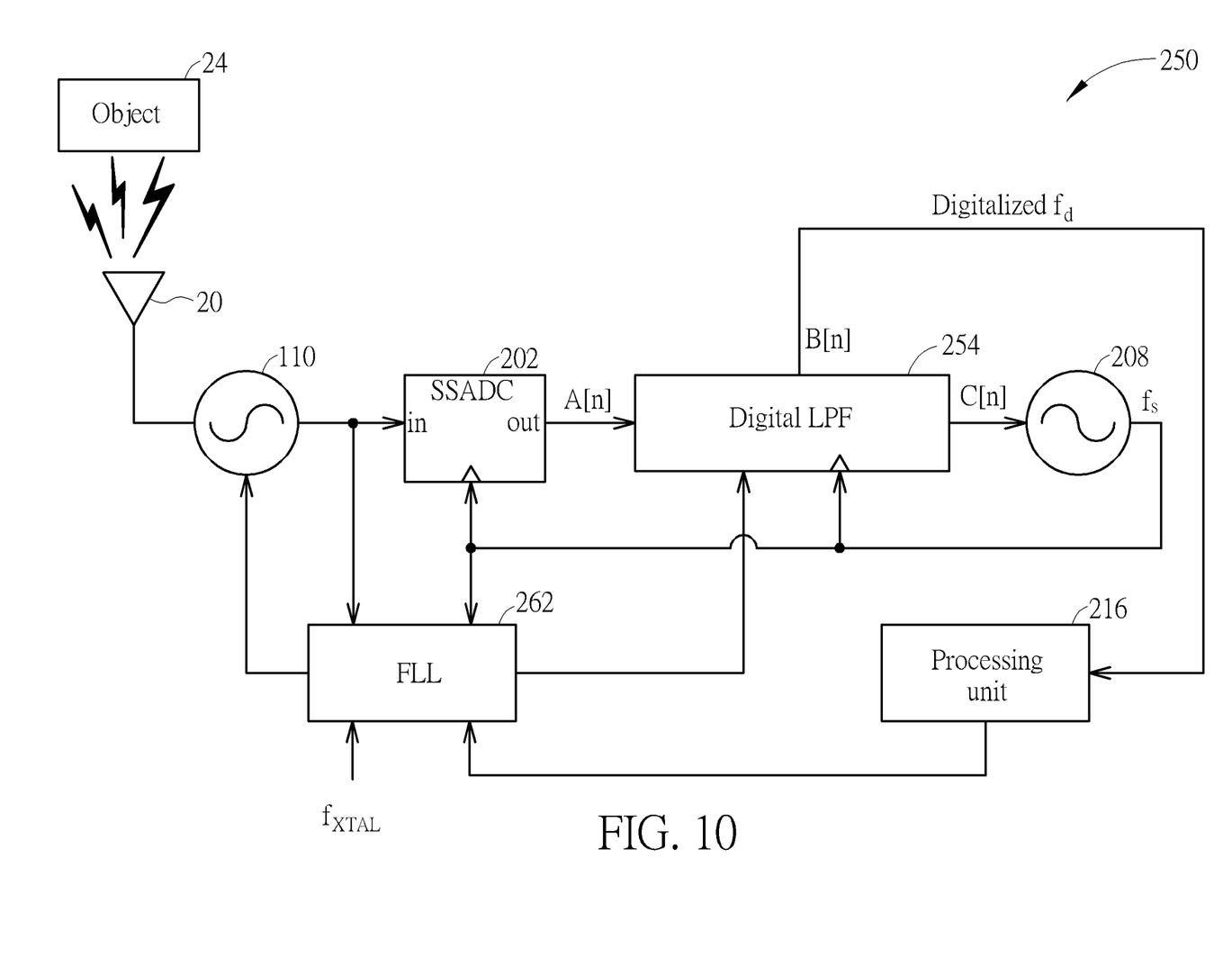
FIG. 10 illustrates a motion detector according to a sixth embodiment of the present invention.

Please refer to FIG. 10. FIG. 10 illustrates a motion detector 250 according to a sixth embodiment of the present invention. Similar to the motion detector 200 of FIG. 9, the motion detector 250 differs in that the digital LPF 204 and the digital LPF 206 are replaced with a single digital LPF 254 and in that an FLL 262 receives a reference frequency $f_{XTAL}$ from a crystal oscillator or other reference generator. The SSADC 202 outputs the phase detection digital output signal A[n] according to the detected phase difference between the high frequency oscillation signal and the low frequency oscillation signal $f_s$ at time periods indicated by the low frequency oscillation signal $f_s$. This phase detection digital output signal A[n] is input into the digital LPF 254. The digital LPF 254 converts the phase detection digital output signal A[n] into the digital control signal C[n] that is used for controlling the DCO 208, and also converts the phase detection digital output signal A[n] into a motion output signal B[n] representing a digitalized version of the Doppler shift $f_d$, which is in turn transmitted to the processing unit 216. The relationship between the reference frequency $f_{XTAL}$ the low frequency oscillation signal $f_s$, and the carrier frequency $f_c$ output by the high frequency oscillator 110 is explained as follows. The low frequency oscillation signal $f_s$ is a first multiple or fractional multiple M of the reference frequency $f_{XTAL}$. The carrier frequency $f_c$ is a second multiple N of the low frequency oscillation signal $f_s$. Thus, the carrier frequency $f_c$ is equal to M*N the reference frequency $f_{XTAL}$, where M is either an integer or a fractional value greater than 1, and N is either an integer or a fractional value greater than 1 that may be equal to or different to the value of M. In this embodiment, a lower cost and lower frequency (such as 32.768 kHz) crystal oscillator is enough to calibrate both the low frequency oscillation signal $f_s$ and the carrier frequency $f_c$. As in other embodiments, in order to prevent aliasing effect, the low frequency oscillation signal $f_s$ should be greater than or equal to twice the frequency difference $\Delta f$.

Figure 11:
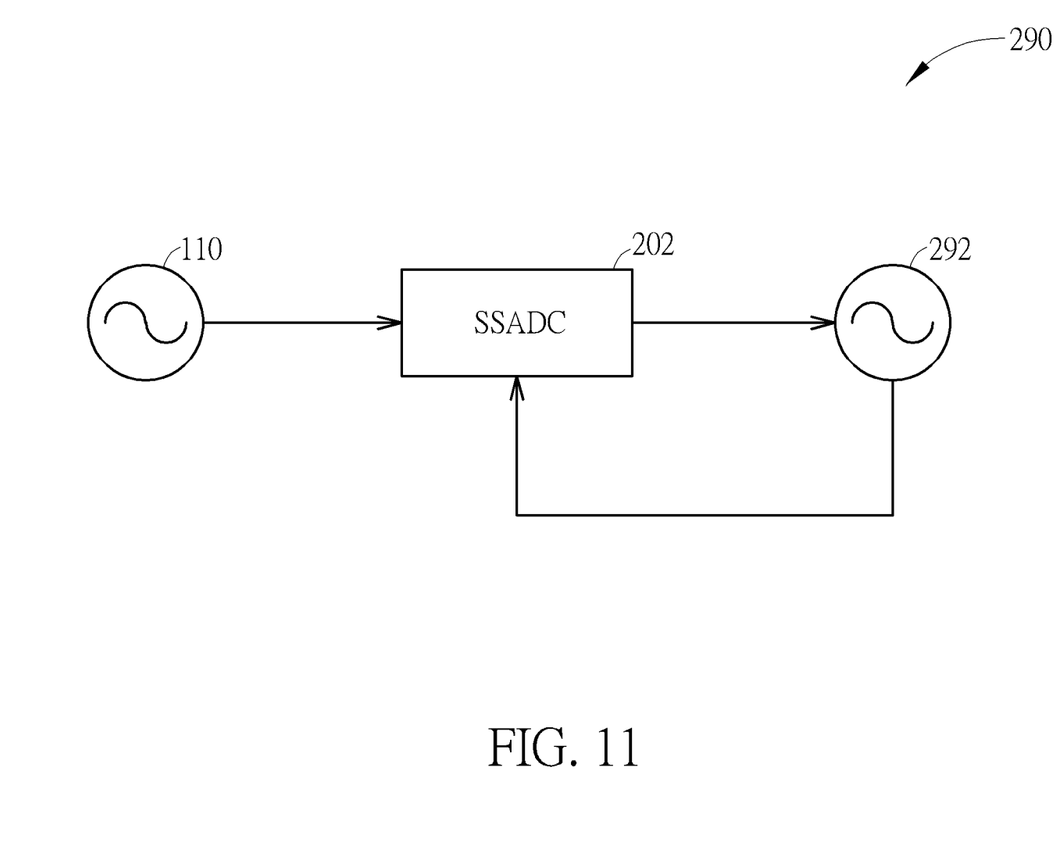
FIG. 11 illustrates a motion detector depicting a generalized version of the fifth embodiment and the sixth embodiment of the present invention.

Please refer to FIG. 11. FIG. 11 illustrates a motion detector 290 depicting a generalized version of the fifth embodiment and the sixth embodiment of the present invention. The motion detector 290 contains the high frequency oscillator 110, the SSADC 202, and a low frequency controllable oscillator 292. The low frequency controllable oscillator 292 can be realized as the low frequency DCO 208. Operation of the motion detector 290 is similar to that of the motion detectors 200 and 250 described in FIG. 9 and FIG. 10, respectively, and will not be repeated for the sake of brevity.

In summary, the embodiments of present invention try to avoid the need for a frequency divider that is common in other motion detectors. By lowering the sampling rate using subsampling, the overall power consumption of the motion detector could be lowered considerably without sacrificing the accuracy of detection.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A subsampling motion detector configured to detect motion information of an object under measurement, the subsampling motion detector receiving a first wireless radio frequency (RF) signal and transmitting a second wireless RF signal, the first wireless RF signal being generated by reflecting the second wireless RF signal from the object, the subsampling motion detector comprising:
   a high frequency oscillator outputting a high frequency oscillation signal, wherein the first wireless RF signal is injected to the high frequency oscillator for controlling the high frequency oscillator through injecting locking;
   a low frequency controllable oscillator different from the high frequency oscillator, for generating a low frequency oscillation signal according to a control signal, wherein a frequency of the high frequency oscillation signal is a multiple or fractional multiple of a frequency of the low frequency oscillation signal, and the low frequency oscillation signal is different from the first wireless RF signal, the second wireless RF signal and the high frequency oscillation signal; and
   a subsampling analog-to-digital converter (SSADC) receiving the high frequency oscillation signal and the low frequency oscillation signal and detecting a phase difference between the high frequency oscillation signal and the low frequency oscillation signal at time periods indicated by the low frequency oscillation signal, the SSADC outputting a phase detection digital output signal according to the detected phase difference, the control signal being generated according to the phase detection digital output signal output from the SSADC, and the motion information of the object being calculated according to the phase detection digital output signal.

2. The subsampling motion detector of claim 1, wherein the low frequency controllable oscillator is a digitally controlled oscillator (DCO) and the control signal is a digital control signal, and the subsampling motion detector further comprises:
   a digital low-pass filter converting the phase detection digital output signal into the digital control signal.

3. The subsampling motion detector of claim 2, wherein the digital low-pass filter comprises:
   a low bandwidth digital low-pass filter converting the phase detection digital output signal into a motion output signal representing the motion information of the object; and
   a high bandwidth digital low-pass filter converting the phase detection digital output signal into the digital control signal.

4. The subsampling motion detector of claim 3, further comprising:
   a frequency lock loop (FLL) receiving the low frequency oscillation signal and the high frequency oscillation signal, the FLL controllably turned on and off, and the FLL assisting the SSADC with detecting the phase difference between the high frequency oscillation signal and the low frequency oscillation signal when the FLL is turned on.

5. The subsampling motion detector of claim 2, wherein the digital low-pass filter converts the phase detection digital output signal into the digital control signal, the subsampling motion detector further comprising:
   a frequency lock loop (FLL) receiving the low frequency oscillation signal and the high frequency oscillation signal, the FLL controllably turned on and off, and the FLL assisting the SSADC with detecting the phase difference between the high frequency oscillation signal and the low frequency oscillation signal when the FLL is turned on;
   wherein the FLL receives input of a reference frequency provided by a crystal oscillator.

6. The subsampling motion detector of claim 1, wherein the frequency of the low frequency oscillation signal is greater than or equal to twice a frequency difference between the first wireless RF frequency and a frequency of the high frequency oscillation signal, the frequency difference being equal to a sum of a Doppler frequency shift caused by the object and an environmental injection pulling frequency shift.

7. The subsampling motion detector of claim 1, further comprising an antenna receiving the first wireless RF signal and transmitting the second wireless RF signal, wherein the high frequency oscillator is electrically connected to the antenna and outputs the high frequency oscillation signal to the antenna, and the first wireless RF signal received by the antenna is injected to the high frequency oscillator.

8. The subsampling motion detector of claim 1, wherein the high frequency oscillation signal is different from the first wireless RF signal.

9. The subsampling motion detector of claim 1, wherein the high frequency oscillation signal is different from the first wireless RF signal and the second wireless RF signal.

* * * * *